United States Patent
Chang et al.

(10) Patent No.: US 6,445,051 B1
(45) Date of Patent: Sep. 3, 2002

(54) METHOD AND SYSTEM FOR PROVIDING CONTACTS WITH GREATER TOLERANCE FOR MISALIGNMENT IN A FLASH MEMORY

(75) Inventors: Mark S. Chang, Los Altos; Hao Fang, Cupertino; King Wai Kelwin Ko; John Jianshi Wang, both of San Jose; Michael K. Templeton, Atherton; Lu You, Santa Clara; Angela T. Hui, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/563,797

(22) Filed: May 2, 2000

Related U.S. Application Data

(60) Provisional application No. 60/172,433, filed on Dec. 17, 1999.

(51) Int. Cl.[7] .............................................. H01L 29/76

(52) U.S. Cl. ........................ 257/401; 257/368; 257/57; 257/66

(58) Field of Search .................... 257/57–61, 66–72, 257/368–401, 903, 904, 325, 346, 366

(56) References Cited

U.S. PATENT DOCUMENTS

| | | | | |
|---|---|---|---|---|
| 5,726,100 A | * | 3/1998 | Givens | 438/702 |
| 6,274,900 B1 | * | 8/2001 | San et al. | 257/314 |
| 6,297,167 B1 | * | 10/2001 | Wang et al. | 438/714 |

* cited by examiner

Primary Examiner—Nathan J. Flynn
Assistant Examiner—Scott R Wilson
(74) Attorney, Agent, or Firm—Sawyer Law Group LLP

(57) ABSTRACT

A method and system for providing a plurality of contacts in a flash memory device is disclosed. The flash memory device includes a plurality of gate stacks and a plurality of field insulating regions adjacent to a portion of the plurality of gate stacks. The method and system include providing an etch stop layer covering the plurality of field insulating regions. The etch stop layer has an etch selectivity different from a field insulating region etch selectivity of the plurality of field insulating regions. The method and system also include providing an insulating layer covering the plurality of gate stacks, the plurality of field insulating regions and the etch stop layer. The method and system further include etching the insulating layer to provide a plurality of contact holes. The insulating layer etching step uses the etch stop layer to ensure that the insulating etching step does not etch through the plurality of field insulating regions. The method and system also include filling the plurality of contact holes with a conductor.

9 Claims, 5 Drawing Sheets

US 6,445,051 B1

METHOD AND SYSTEM FOR PROVIDING CONTACTS WITH GREATER TOLERANCE FOR MISALIGNMENT IN A FLASH MEMORY

CROSS REFERENCE TO RELATED APPLICATIONS

This application claims benefit of U.S. Provisional Patent application Ser. No. 60/172,433 filed Dec. 17, 1999, the disclosure of which is incorporated herein by reference.

FIELD OF THE INVENTION

The present invention relates to flash memory devices, and more particularly to a method and system for providing a contact in a flash memory device in which alignment, for example to a field oxide, is not critical.

BACKGROUND OF THE INVENTION

Semiconductor memories are finding increasing use in many devices. For example, FIG. 1 depicts a portion of a dynamic random access memory (DRAM) 10 during fabrication. The DRAM 10 is formed using a semiconductor substrate 11 and includes polysilicon lines 14. Between polysilicon lines 14 is a junction 12. The polysilicon lines 14 are also separated by spacers 15. The polysilicon lines 14 are covered by an etch stop layer 16 and an insulator 17. In order to make contact to the junction 12, a contact hole 18 has been etched in the insulator 17. The etch stop layer 16 has a different etch selectivity than the insulator 17. Consequently, an etch of the insulator does not greatly etch the etch stop layer 16. Once the contact hole 18 has been etched, the portion of the etch stop layer 16 exposed by the contact hole 18 can be removed, the contact hole filled with a conductor and processing of the DRAM can be completed. Consequently, the DRAM 10 can be used.

Although the DRAM 10 can be used as a memory device, one of ordinary skill in the art will readily realize that the DRAM 10 is a volatile memory. The DRAM 10 cannot retain its information when no power is provided to. the DRAM 10. Consequently, the DRAM 10 cannot be used for many applications.

Flash memory devices are a popular form of nonvolatile storage. Flash memory devices can, therefore, retain information when no power is supplied to the device. Flash memory devices include memory cells that include a gate stack, a source and a drain. Unlike the conventional DRAM 10, each gate stack typically includes a floating gate. Each gate stack also includes a control gate separated from the floating gate by an insulating layer. The insulating layer is typically-a composite ONO layer including two oxide layers separated by a nitride layer. Some memory cells may be separated by field oxide regions. Contact is made to the source and drain regions.

FIG. 2A depicts a conventional method 20 for providing a conventional flash memory device. Field oxide regions, gate stacks, source and drain regions, and spacers are provided, via step 22. An insulating layer is provided on the gate stacks and field oxide regions, via step 24. Contact holes are then etched in the insulating layer by very carefully aligning a mask to expose the regions to be etched and etching the exposed regions of the insulating layer, via step 26. The contact holes are typically provided over the source or drain regions. Contact holes may also be provided for other structures. However, the contact holes to make contact to the source or drain region are typically the deepest. The contact holes are then filled using a conductive material, via step 30. Processing of the conventional flash memory device can then be continued, via step 32.

FIG. 2B depicts a portion of a conventional flash memory device 50 formed using the method 20. The conventional flash memory device includes a gate stack 60 formed on a semiconductor substrate 51. Adjacent to the gate stack 60 is a field oxide region 52. The field oxide region is separated from the gate stack by a source/drain region 54. Because the source and drain in a flash memory cell are typically similar from the standpoint of contact formation, such regions will be referred to as source/drain regions. Another source/drain region 56 is located on an opposing side of the gate stack 60. The gate stack 60 includes a floating gate 64 separated from the substrate 51 by an oxide layer 62, an insulating layer 66 and a control gate 68. The floating gate 64 and control gate 68 are typically formed of polysilicon. The insulating layer 66 is typically a composite, ONO layer composed of two layers of oxide separated by a nitride layer. Spacers 63 and 65 may also be provided. The field oxide region 52, gate stack 60 and source/drain regions 54 and 56 have been covered by an insulating layer 70. A contact hole 72 has been etched- into the insulating layer, via step 26 of the method 20. The contact hole 72 has been filled with conductive material 74. Consequently, contact can be made to the source/drain region 54.

Although the conventional flash memory device 50 functions, one of ordinary skill in the art will readily realize that the contact can be misaligned during the photolithography process. In particular, if the alignment of the mask used to etch the contact holes in step 26 of the method 20 is not very carefully controlled, a portion of the field oxide region may be exposed during the etch of the contact hole 72. The field oxide region 52 is also typically composed of a material that is the same as or, in terms of etch selectivity, very similar to the insulating layer 76. Furthermore, end-point detection is difficult because contact holes occupy a very small percentage of the surface of the flash memory devices. Consequently, conventional optical emission techniques may not be capable of detecting when the field oxide 52 or source/drain regions 54 are exposed. As a result, the contact holes 72 are typically over-etched to ensure that the electrical contact can be made to the source/drain regions 54. The field oxide region 72 may thus be easily punched through during the contact hole etch, exposing a portion of the underlying substrate 51, when contact holes 72 are misaligned. Making electrical contact to both the source/drain region 54 and the underlying silicon substrate 51 is undesirable. Moreover, it may be very difficult, if not impossible, to properly align the contact hole 72. Thus, a mechanism for accounting for misalignments must be used in forming the conventional flash memory device 50.

In order to account for misalignments during etching of contact holes, another conventional method has been developed. FIG. 3A depicts another conventional method 20' for providing a conventional flash memory device. The conventional method 20' is very similar to the conventional method 20. Consequently, similar steps will be labeled similarly. Field oxide regions, gate stacks and source and drain regions are provided, via step 22'. An insulating layer is provided on the gate stacks and field oxide regions, via step 24'. Contact holes are then etched in the insulating layer, via step 26'. The contact holes are typically provided over the source or drain regions. Because of misalignments which may occur, an additional implant is typically provided, via step 28. The implant is of the same type as the source and drain implants. Thus, the implant provided in step 28 is typically a p+implant. The contact holes are then filled using a conductive material, via step 30'. Processing of the conventional flash memory device can then be continued, via step 32'.

FIG. 3B depicts a conventional flash memory device 50' in which the contact is misaligned and in which the method 20' has been used for fabrication. The conventional flash memory device 50' has essentially the same components as the conventional flash memory device 50 depicted in FIG. 3A. Corresponding structures are, therefore, labeled similarly. For example, the gate stack 60' of the conventional flash memory 50' corresponds to the gate stack 60 of the conventional flash memory 50 shown in FIG. 3A. Referring back to FIG. 3B, the contact hole 72' is slightly misaligned. As a result, a portion of the contact hole 72' is above the field oxide region 52'. The field oxide region 52' is, therefore, etched when the contact hole 72' is etched into the insulating layer 70'. As depicted, the etch which formed the contact hole 72 has punched through the edge of the field oxide region 72', exposing a portion of the underlying semiconductor substrate 51'. In order to ensure that the conductor 74' filling the contact hole 72' is not exposed to varying doping concentrations, an additional doped region 76 is provided in the conventional semiconductor device 50'. Using step 28 of the conventional method 20', the additional doped region 76 is provided by performing an additional implant after the contact holes have been etched.

Although the conventional flash memory cell 50' functions, one of ordinary skill in the art will readily realize that an additional dopant is provided in the contact holes. Providing this additional dopant complicates processing. However, without the additional doped region, the alignment of the mask used during the contact hole etch must be very carefully performed. Consequently, use of either the method 20 or the method 20' is undesirable.

Accordingly, what is needed is a system and method for providing contacts for a flash memory device which is simpler and for which alignment is not as critical. The present invention addresses such a need.

SUMMARY OF THE INVENTION

The present invention provides a method and system for providing a plurality of contacts in a flash memory device. The flash memory device includes a plurality of gate stacks and a plurality of field insulating regions adjacent to a portion of the plurality of gate stacks. The method and system comprise providing an etch stop layer covering the plurality of field insulating regions. The etch stop layer has an etch selectivity different from a field insulating region etch selectivity of the plurality of field insulating regions. The method and system also comprise providing an insulating layer covering the plurality of gate stacks, the plurality of field insulating regions and the etch stop layer. The method and system further comprise etching the insulating layer to provide the contact holes. The insulating layer etching step uses the etch stop layer to ensure that the insulating etching step does not etch through the plurality of field insulating regions. The method and system also comprise filling the plurality of contact holes with a conductor.

According to the system and method disclosed herein, the present invention provides flash memory device contacts in a manner which is simpler and does not require as precise alignment.

DETAILED DESCRIPTION OF THE INVENTION

Figure 1:
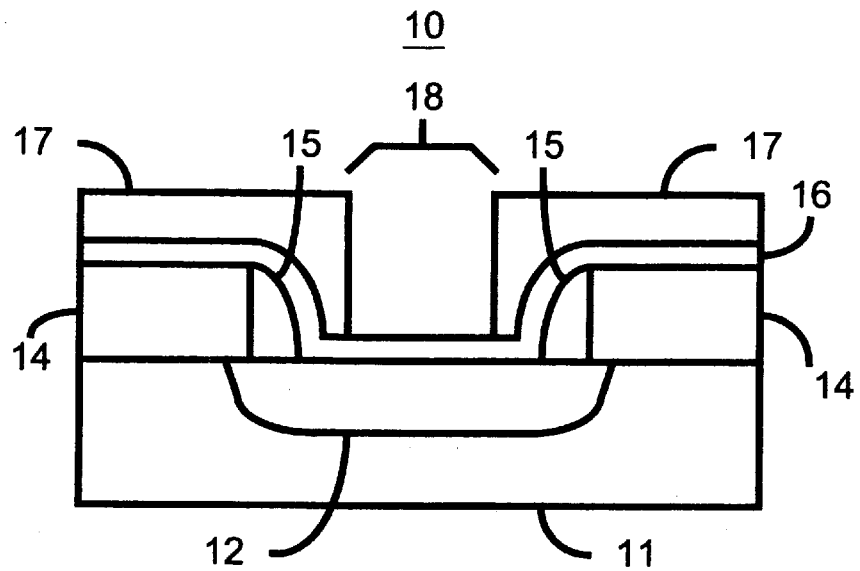
FIG. 1 is a block diagram of a portion of a conventional DRAM memory devices.
Figure 2A:
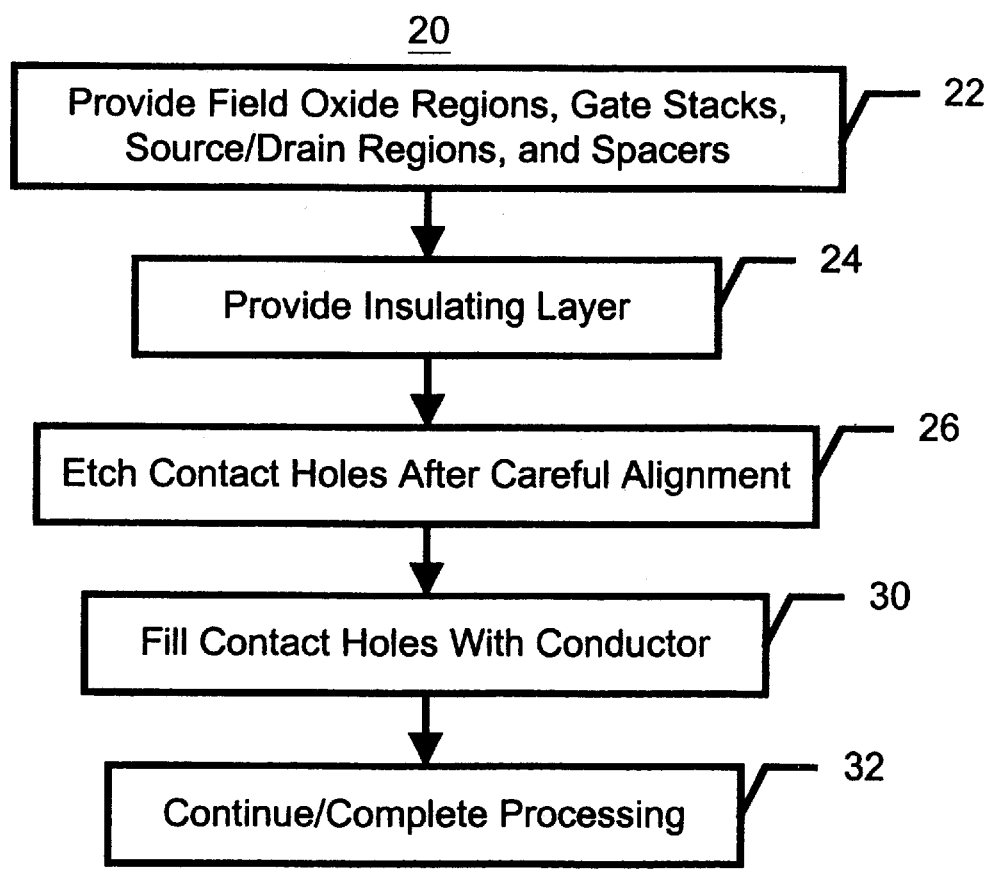
FIG. 2A is a block diagram of a conventional method for providing flash memory devices.
Figure 2B:
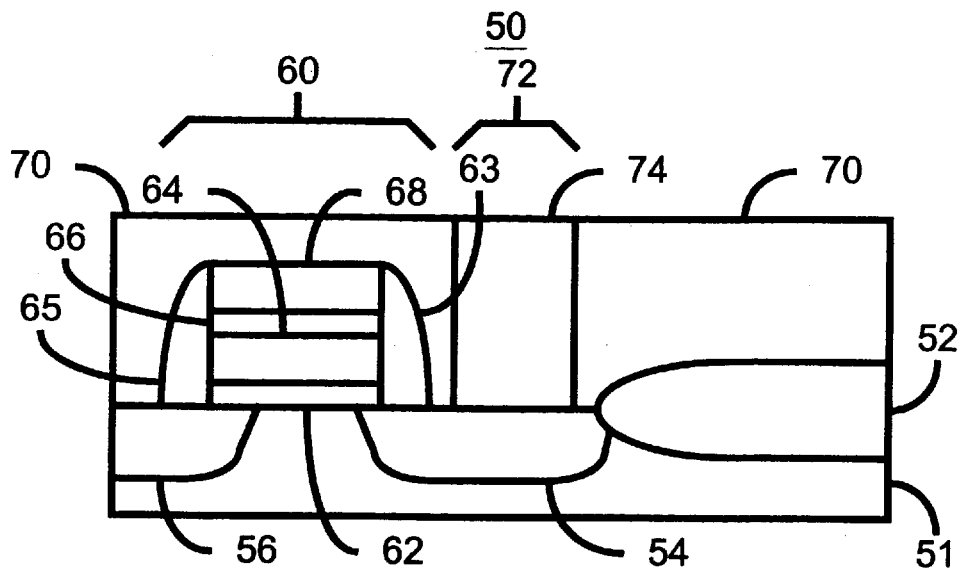
FIG. 2B is a block diagram of a portion of a conventional flash memory device when the contact has been properly aligned.
Figure 3A:
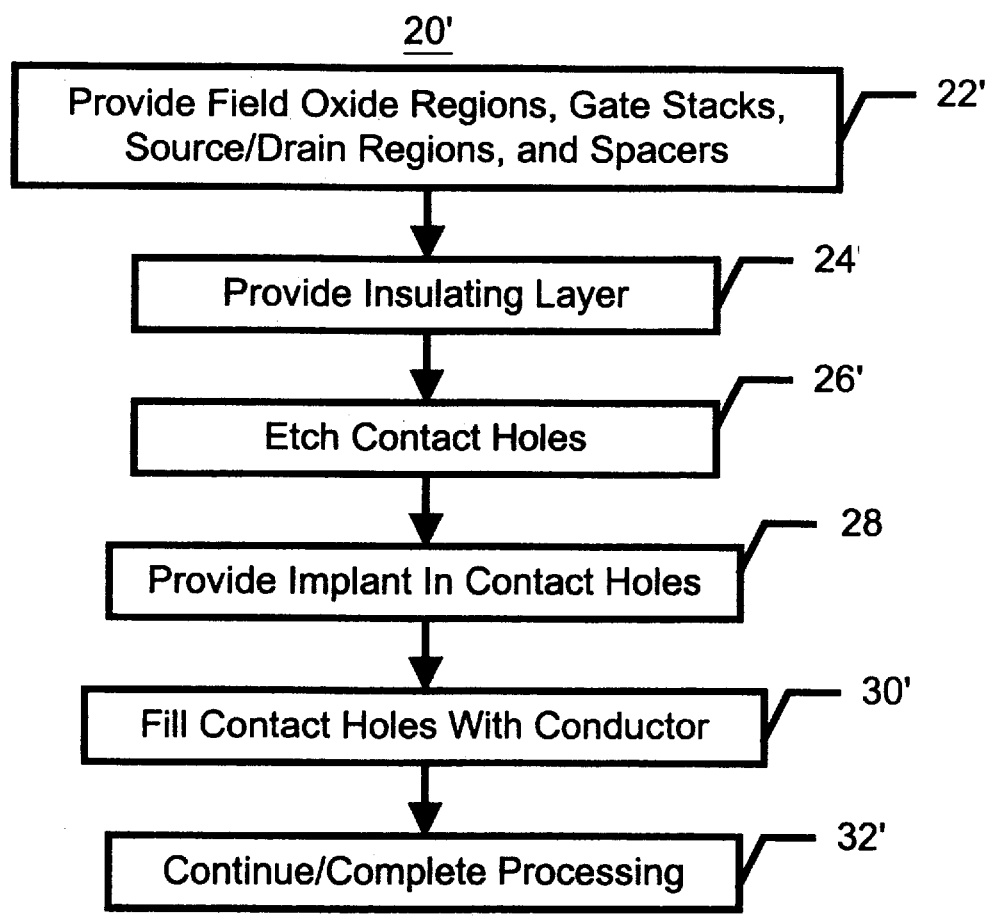
FIG. 3A is a block diagram of another conventional method for providing flash memory devices.
Figure 3B:
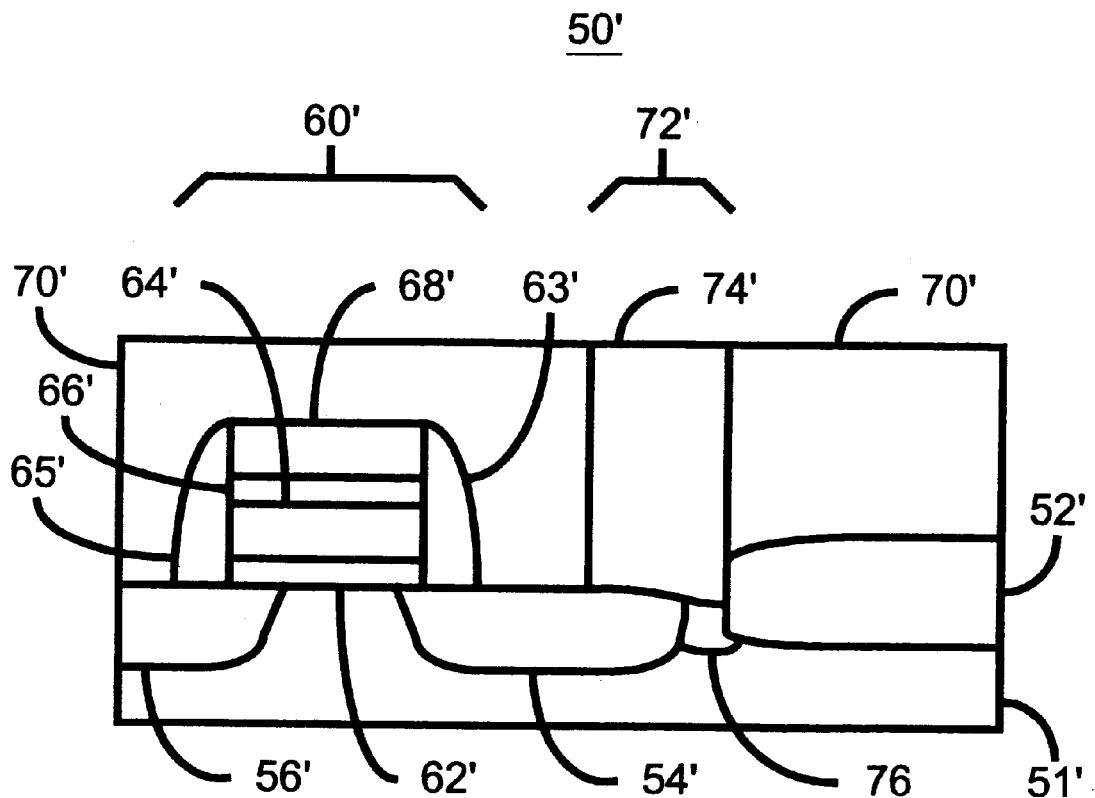
FIG. 3B is a block diagram of a portion of a conventional flash memory device when the contact has not been properly aligned.

The present invention relates to an improvement in fabrication of flash memory devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Current memory devices include dynamic random access memory ("DRAM") devices and flash memory devices. Although conventional DRAM devices can be fabricated relatively easily, DRAM devices typically do not use floating gates and cannot be used for nonvolatile storage. Flash memory devices are nonvolatile storage devices. However, fabrication of flash memory devices is complicated by the alignment of contacts. In etching contact holes in insulating layers in one conventional method for providing a conventional flash memory device, the alignment of the contact holes must be very carefully controlled to prevent exposing a portion of the semiconductor substrate under field oxide regions. This level of alignment is difficult, if not impossible, to achieve. In the alternative, a conventional flash memory device utilizes an additional implant within the contact holes to account for exposure of the underlying substrate. Although this method functions, the additional implant complicates processing.

The present invention provides a method and system for providing a plurality of contacts in a flash memory device. The flash memory device includes a plurality of gate stacks and a plurality of field insulating regions adjacent to a portion of the plurality of gate stacks. The method and system comprise providing an etch stop layer covering the plurality of field insulating regions. The etch stop layer has an etch selectivity different from a field insulating region etch selectivity of the plurality of field insulating regions. The method and system also comprise providing an insulating layer covering the plurality of gate stacks, the plurality of field insulating regions and the etch stop layer. The method and system further comprise etching the insulating layer to provide a plurality of contact holes. The insulating layer etching step uses the etch stop layer to ensure that the insulating etching step does not etch through the plurality of field insulating regions. The method and system also comprise filling the plurality of contact holes with a conductor.

The present invention will be described in terms of a particular flash memory device having certain components. However, one of ordinary skill in the art will readily recognize that this method and system will operate effectively for other components or other materials. For example, the present invention will be described in the context of the use of field oxide regions and other specific materials used for certain components. However, the present invention is consistent with the use of another insulating material for the field oxide region and other materials used for other components.

Figure 4A:
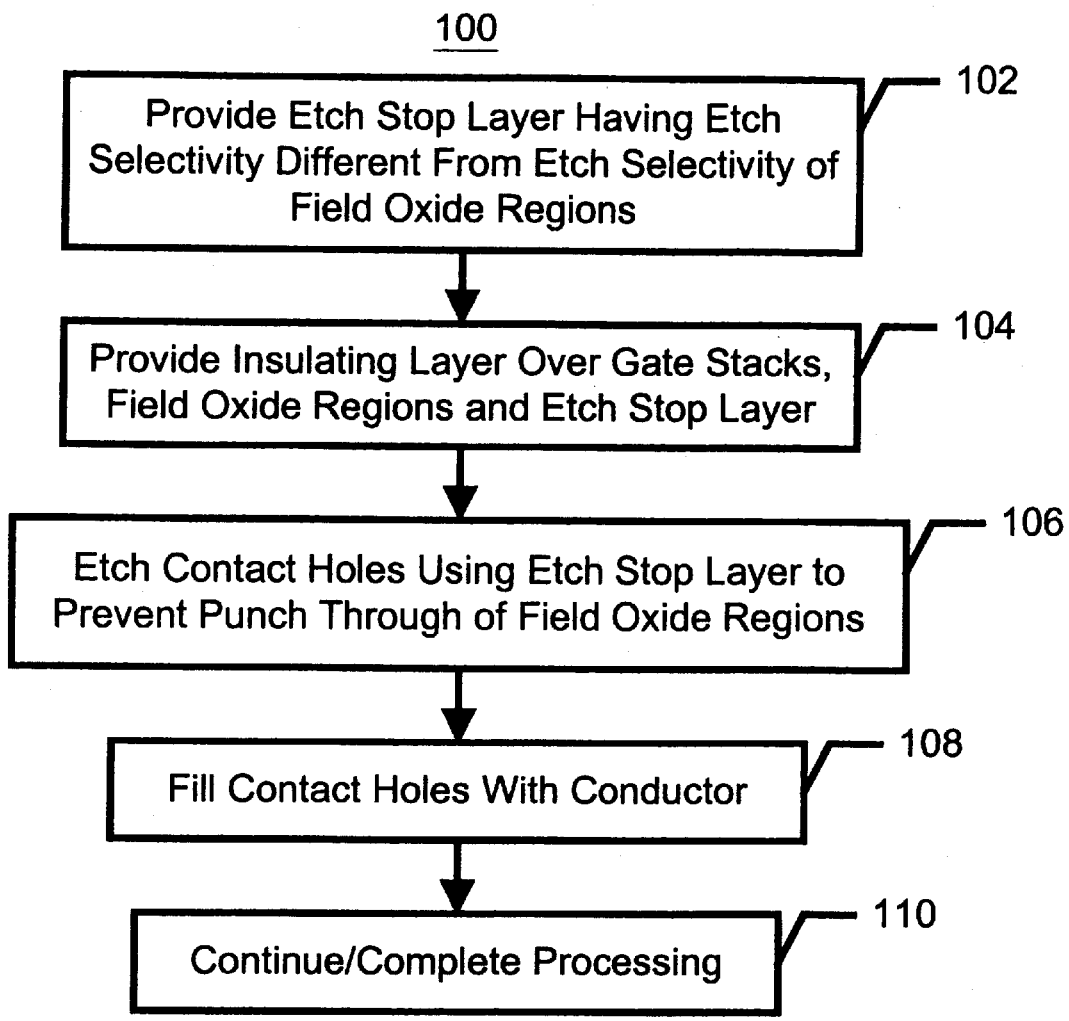
FIG. 4A is a flow-chart of one embodiment of a method in accordance with the present invention for providing contacts for a flash memory device.

To more particularly illustrate the method and system in accordance with the present invention, refer now to FIG. 4A, depicting one embodiment of a method 100 for providing a flash memory device in accordance with the present invention. The method 100 preferably commences after the gate stacks, source and drain regions, spacers and field oxide regions have been provided. An etch stop layer covering at least the field oxide regions is provided, via step 102. The etch stop layer has an etch selectivity which is different from the etch selectivity of the underlying field oxide regions. In a preferred embodiment, the etch stop layer covers both the field oxide regions and the gate stacks. Thus, step 102 preferably includes depositing the etch stop layer without attempting to mask gate stacks or other portions of the flash memory device. Also in a preferred embodiment, the etch stop layer is transparent to ultraviolet ("UV") light. This property is desired because the memory cells, or gate stacks, of the flash memory device are generally erased using UV light. When the gate stacks are covered by the etch stop layer and, as discussed below, the etch stop layer over the gate stacks is not removed, then the etch stop layer should be transparent to UV light in order to allow the flash memory device to function properly. Thus, the etch stop layer preferably includes a SiON layer or a SiN layer. Also in a preferred embodiment, the etch stop layer is relatively thin to facilitate removal without significant damage to the field oxide regions. For example, in one embodiment, the etch stop layer is on the order of a few hundred Angstroms. Thus, in one embodiment, the etch stop layer is less than approximately five hundred Angstroms.

Once the etch stop layer has been provided, the insulating layer is provided, via step 104. The insulating layer covers the gate stacks, the field oxide regions and, therefore, the etch stop layer. Contact holes are then etched into the insulating layer without punching through the field oxide regions, via step 106. The etch stop layer provided in step 102 helps prevent the etch performed in step 106 from punching through the field-oxide regions. In other words, the etch stop layer changes the etching chemistry such that the field oxide region will not be etched through. Preferably, the etch stop layer also has a high etch selectivity compared to the etch selectivity of the insulating layer. Generally, the insulating layer is composed of the same material as or similar materials to the field oxide regions. The etch selectivity of the etch stop layer will, therefore, usually be quite different from that of the insulating layer and the field oxide region. For the contact hole etch performed in step 106, the etch selectivity of the etch stop layer is preferably much higher than that of the insulating layer. The etch stop layer can later be removed with high selectivity with respect to that of the field oxide. The presence of the etch stop thus layer facilitates the ease in performing step 106. The contact holes are then filled with a conductor, via step 108. Processing of the flash memory device is then completed, via step 110.

Figure 4B:
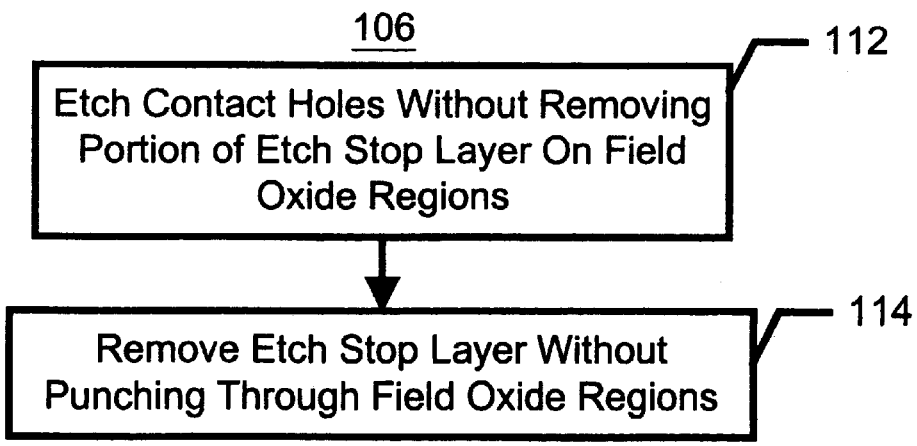
FIG. 4B is a flow-chart depicting one embodiment of a method for etching contact holes in accordance with the present invention.

FIG. 4B depicts a preferred embodiment of a method for performing step 106. The contact holes are etched such that a portion of the etch stop layer remains on the field oxide regions, via step 112. In other words, the etch stop layer is not etched through when the contact holes are formed in step 112. The etch stop layer exposed in the contact holes is then removed, via step 114. In an alternate embodiment, the etch stop layer covering the gate stack regions can also be removed. Preferably the etch selectivity of the etch stop layer to the etch performed to remove the etch stop layer in step 114 is much higher than that of the field oxide regions.

Because the etch stop layer has a different etch selectivity than the insulating layer or the field oxide region, the contact holes can typically be etched to the desired depth without removing the etch stop layer. The contact holes can be etched without punching through the field oxide regions. Furthermore, when the etch stop layer is removed, little or none of the field oxide region is removed because the etch selectivity of the etch stop layer is high compared to that of the field oxide and because only a minimal overetch after the etch stop layer is removed (minimum etch exposure of the field oxide) can be performed. Consequently, even when the mask used in etching the contact holes is misaligned, the semiconductor substrate under the field oxide region is not exposed. Consequently, an additional implant need not be provided. Processing of the flash memory device is, therefore, facilitated.

Figure 5A:
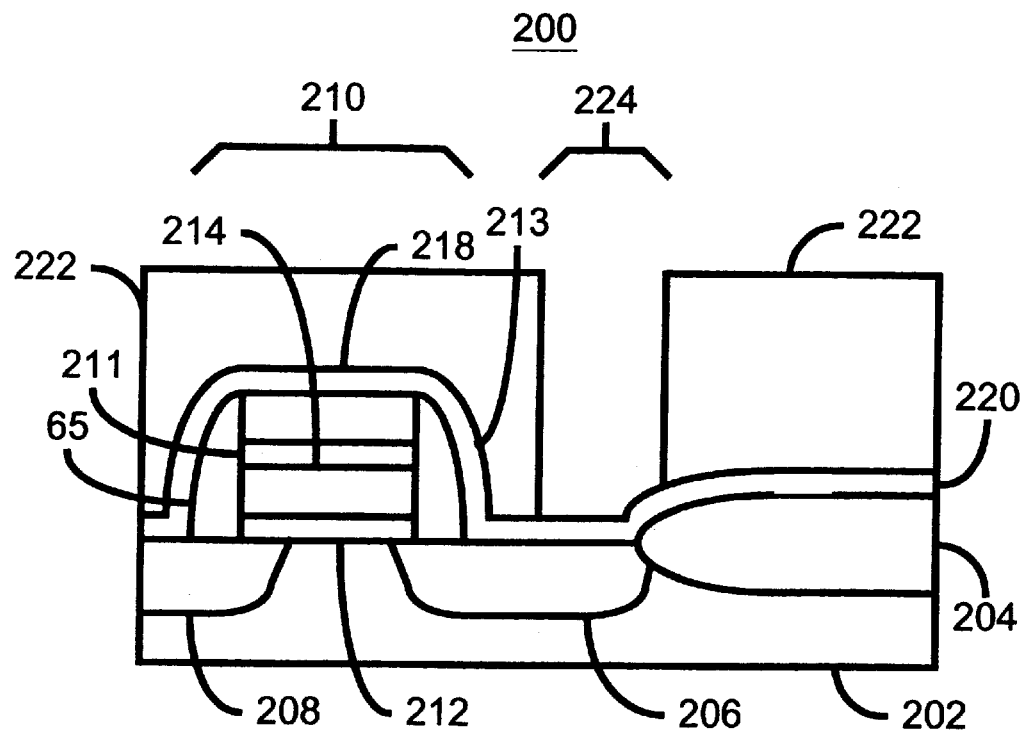
FIG. 5A is a block diagram of one embodiment of a portion of a flash memory device in accordance with the present invention after the insulating layer has been etched.
Figure 5B:
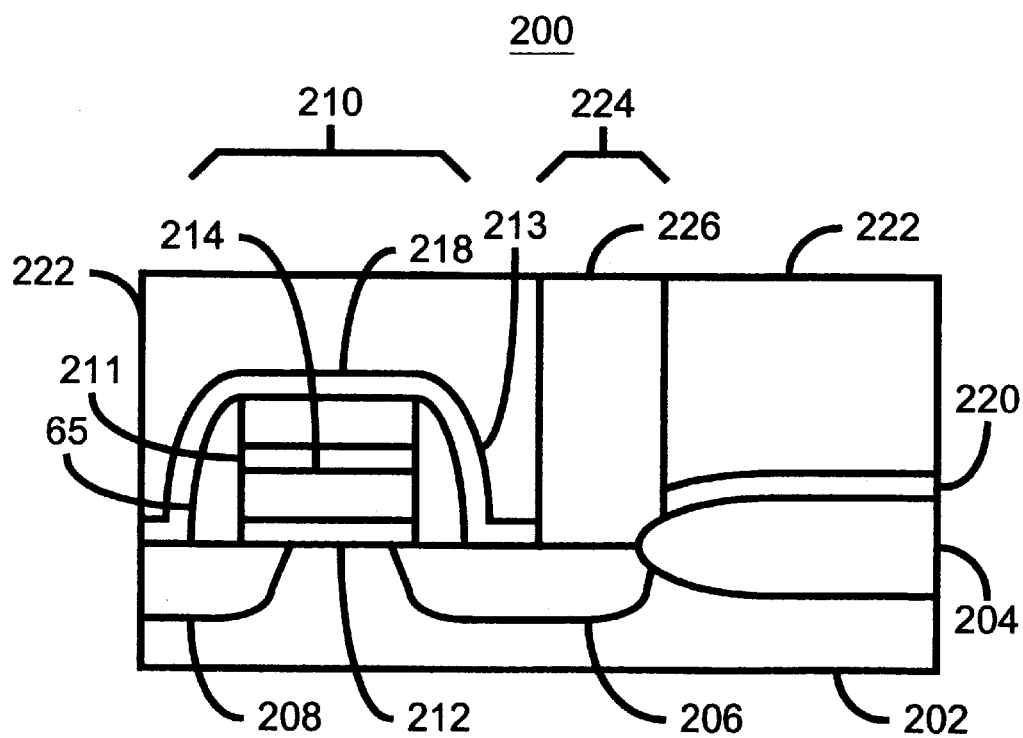
FIG. 5B is a block diagram of one embodiment of a portion of a flash memory device in accordance with the present invention after the contact hole has been filled.

FIGS. 5A and 5B depict a portion of one embodiment of a flash memory device 200 in accordance with the present invention. Because only a portion of the flash memory device 200 is shown, many components depicted in FIGS. 5A and 5B are repeated elsewhere in the flash memory device.

FIG. 5A depicts the flash memory device 200 after the contact holes etching step 106 (shown in FIG. 4A) has been performed. Referring back to FIG. 5A, the flash memory device 200 includes a gate stack 210 formed on a semiconductor substrate 202. The gate stack includes a thin oxide layer 212, a floating gate 214, an insulating layer 216 and a control gate 218. The floating gate 214 and the control gate 218 preferably include polysilicon. The insulating layer 216 is preferably a composite ONO layer, which includes two layers of oxide separated by a nitride layer. Source/drain regions 206 and 208 are on opposing sides of the gate stack 210. Spacers 211 and 213 are also located on opposite sides of the gate stack 210. Also adjacent to the gate stack is a field oxide region 204. Note, however, that the source/drain region 206 separates the field oxide region 204 from the gate stack 210. In addition, although termed an oxide, the field oxide region 204 could include other insulating materials. The etch stop layer 220 is shown as covering the gate stack 210 region and the field oxide region 204. However, in an alternate embodiment, the etch stop layer 220 may only cover an area on and around the field oxide region 204. An insulating layer 222 covers the gate stack 210, the field oxide region 204 and the etch stop layer 220. The contact hole 224 has been etched, exposing a portion of the etch stop layer 220. However, the field oxide region 204 has not been punched through. The etch stop layer 220 is shown as remaining over the field oxide region 204 and the source/drain region 206. However, nothing prevents removal of more or all of the etch stop layer 220 under the contact hole 224 as long as the field oxide region 204 is not punched through.

FIG. 5B depicts the flash memory device 200 after the contact holes have been filled using the step 108, depicted in FIG. 4A. Referring back to FIG. 5B, the portion of the etch stop layer 220 exposed by the contact hole 224 has been removed. However, because the etch stop layer 220 has a different etch selectivity and, therefore, etch chemistry than the field oxide region 204 and because the field oxide region 204 is exposed to an etch for only a very short time, the exposed portion of the etch stop layer 220 is removed without punching through the field oxide region 204. The conductor 226 filling the contact hole 224 thus makes contact to the source/drain region 206 without contacting the underlying substrate 202. Consequently, electrical contact can be made to the source/drain region 206 without very careful control of alignment of the contact hole etch mask and without requiring an additional implant in the contact hole 224.

A simplified method and system has been disclosed for providing contact holes in a flash memory device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A flash memory device comprising:
   a plurality of gate stacks including a plurality of floating gates and a plurality of control gates disposed on a semiconductor substrate;
   a plurality of field insulating regions on the semiconductor substrate adjacent to a portion of the plurality of gate stacks;
   an insulating layer covering the plurality of gate stacks and the plurality of field insulating regions, the insulating layer having a plurality of contact holes therein, the plurality of contact holes being formed by providing an etch stop layer covering the plurality of field insulating regions, etching the insulating layer to provide the plurality of contact holes, the insulating layer etching step using the etch stop layer to ensure that the insulating etching step does not etch through the plurality of field insulating regions, the etch stop layer having an etch selectivity different from a field insulating region etch selectivity of the plurality of field insulating regions; and
   a conductor for filling the plurality of contact holes;
   wherein a portion of the plurality of contact holes reside partly over a portion of the plurality of field insulating regions.

2. The flash memory device of claim 1 wherein the contact holes are further formed by etching the insulating layer to provide the plurality of contact holes and leave at least a portion of the etch stop layer covering the plurality of field insulating regions.

3. The flash memory device of claim 2 wherein the contact holes are further formed by removing the at least the portion of the etch stop layer covering the plurality of field insulating regions.

4. The flash memory device of claim 1 wherein the etch stop layer further covers the plurality of gate stacks.

5. The flash memory device of claim 4 wherein the etch stop layer is transparent to ultraviolet light.

6. The flash memory device of claim 4 wherein the etch stop layer is SiON or SiN.

7. The flash memory device of claim 1 wherein the etch stop layer includes SiON or SiN.

8. The flash memory device of claim 1 wherein the etch selectivity of the etch stop layer is different from an insulating layer etch selectivity of the insulating layer.

9. The flash memory device of claim 1 wherein the etch stop layer is less than five hundred Angstroms thick.

* * * * *